(12) United States Patent
Sun et al.

(10) Patent No.: US 6,272,067 B1
(45) Date of Patent: Aug. 7, 2001

(54) SRAM SYNCHRONIZED WITH AN OPTIMIZED CLOCK SIGNAL BASED ON A DELAY AND AN EXTERNAL CLOCK

(75) Inventors: Bruce C. Sun, SJ.; Eric W. Lee, San Jose; Huy Nguyen, Fremont, all of CA (US)

(73) Assignee: Rosun Technologies, Inc., Fremont, CA (US)

( * ) Notice: Subject to any disclaimer, the term of this patent is extended or adjusted under 35 U.S.C. 154(b) by 0 days.

(21) Appl. No.: 09/613,927

(22) Filed: Jul. 11, 2000

(51) Int. Cl.[7] ....................................................... G11C 8/00
(52) U.S. Cl. ................ 365/233; 365/230.06; 395/800.23
(58) Field of Search .............................. 365/233, 230.06, 365/230.01; 395/800.23

(56) References Cited

U.S. PATENT DOCUMENTS 5,930,523 * 7/1999 Kawasaki et al. ............... 395/800.32

* cited by examiner

*Primary Examiner*—Vu A. Le
(74) *Attorney, Agent, or Firm*—Carr & Ferrell, LLP; Morgan E. Malino

(57) ABSTRACT

A synchronous SRAM chip that can increase the number of times it may be accessed within a single clock cycle. By knowing the processor's clock speed and determining a critical time, a signal optimizer may be constructed. The critical time is the longest interval of time required for a worst-case scenario memory access. A signal optimizer transforms the clock signal into a signal that has a higher frequency than the original clock signal and maintains both its high state and its low state for at least the critical time. By then allowing the synchronous SRAM chip to perform its access and pre-charge during the dips and posts of the optimized clock signal, the synchronous SRAM chip can perform multiple accesses and pre-charges during one clock cycle. The SRAM chip can be used for direct memory accesses such that the processor does not need to arbitrate access to the memory.

20 Claims, 7 Drawing Sheets

SRAM SYNCHRONIZED WITH AN OPTIMIZED CLOCK SIGNAL BASED ON A DELAY AND AN EXTERNAL CLOCK

BACKGROUND OF THE INVENTION

1. Field of the Invention

This invention generally relates to electronic memories and more specifically to synchronous Static Random Access Memory design.

2. Description of Related Art

Static Random Access Memory (SRAM) is a type of electronic memory that is faster and more reliable than the more common Dynamic Random Access Memory (DRAM). The term "static" is derived from the fact that SRAM does not need to be refreshed like DRAM. As long as SRAM memory is supplied power, it will retain its memory.

SRAM is often used as cache memory. Some cache memories are built into microprocessors. The Intel® 80486 microprocessor, for example, contains an 8K memory cache, and the Pentium® microprocessor contains a 16K cache. Such internal caches are often called Level 1 (L1) caches. Many modern PCs also come with external cache memory, called Level 2 (L2) cache. These caches reside between the CPU and the DRAM. Like L1 caches, L2 caches are composed of SRAM but are typically much larger.

Regardless of how an SRAM chip is implemented, the architecture is somewhat standard. All SRAM chips contain an array of memory cells. A memory cell stores a single bit of information (1 or 0). Peripheral circuits control how each memory cell is accessed. A unique address refers to either a single bit or a group of bits, depending upon the architecture of the SRAM chip. All references to a "set of memory cells" shall mean the set of bits stored in one address location, regardless of whether the number of bits is singular or plural.

Synchronous SRAM uses a clock signal to time the phases of operation of the SRAM circuit. For active-high logic circuits, the pre-charge phase ("PC phase") is performed during the high portion of the clock signal and the access phase ("AC phase") during the low portion. The phases of an active-low circuit are performed in the opposite clock states. Although the circuits described herein will assume active-high logic, those skilled in the art will be able to apply the concepts to either active-high or active-low circuitry.

During the PC phase, the memory array pre-charges, the address is decoded and the decision of whether to read or write is made. The AC phase is when the actual reading or writing to the memory cell is performed. Since both phases are necessary, only one complete read or write operation can be performed during a full clock period for a standard six transistor SRAM chip.

The cost effectiveness of synchronous SRAM depends partly upon the speed of the clock signal. A system with a clock signal that remains in its high state for longer than is needed to complete the PC phase is inefficient. Similarly, it is inefficient for an SRAM chip to remain in its AC phase for longer than is required while the clock signal is low. The speed of a system clock is usually selected based on the requirements of the processor rather than being selected to optimize operation of an SRAM chip.

Direct Memory Access (DMA) is a technique for transferring data from main memory to a CPU without passing it through a memory management system. A DMA request could occur at either the first half or the second half of a clock cycle. If a DMA request were received in the second half of a clock cycle, a prior art synchronous SRAM chip would not be able to process the request until the next clock cycle.

Additionally, since the majority of SRAM chips are single port chips that only allow one memory access at a time, the microprocessor would be required arbitrate DMA requests. The microprocessor would grant a DMA request by pausing its own use of the memory while allowing the device requesting the DMA to access the memory. Although dual port memory chips are available, they are far too large and costly to be used regularly.

What is needed is a synchronous SRAM chip that overcomes shortfalls of the SRAMs currently known in the art.

BRIEF SUMMARY OF THE INVENTION

The present invention provides an improved SRAM chip synchronized with an external periodic signal and a method for constructing the same. The SRAM chip includes a memory array, control circuitry, an address decoder, pre-charge circuitry, read circuitry and write circuitry. The memory array consists of a plurality of memory cells and their associated bit lines and word lines. The control circuitry is operably connected with and regulates the operation of the memory cells. The "control time" is equal to the interval required for the control circuitry to complete its most time-consuming operation. The address decoder can select any memory cell in the memory array within an "address time." The pre-charge circuitry charges the bit lines of the memory array to a high state within a "pre-charge time." The "critical PC time" is equal to the longest of the control time, the address time or the pre-charge time. The read circuitry receives signals from the bit lines of the memory cells. The write circuitry replaces the signals stored by the memory cells. The most time consuming operation can be completed in a "read time" for the read circuitry and a "write time" for the write circuitry. The "critical AC time" is the time interval equal to the greater of the read time or the write time. A signal optimizer is operably connected to the control circuits and is capable of receiving the external periodic signal and transforming that signal into a higher frequency signal that maintains its high state for at least the critical PC time and its low state for at least the critical AC time.

The method for designing the improved SRAM chip synchronized with an external clock signal according to the present invention begins with designing a preliminary architecture of an SRAM chip including a plurality of memory cells and peripheral circuits. A critical PC time, a critical AC time, and an optimization factor must be determined. The critical PC time is determined from the worst-case scenario circuit in the PC phase, namely the operation that requires the most time to execute during the PC phase. The critical AC time is determined from the worst-case scenario circuit in the AC phase. The optimization factor is a number representing how many times the critical PC time added to the critical AC time will divide into the period of an external clock cycle. An optimization circuit must be designed that can receive a system clock signal as an input and output an optimized clock signal that has a frequency equal to the optimization factor times the frequency of the system clock signal. Additionally, the optimized clock signal must remain in its active state for at least the critical PC time and in its inactive state for at least the critical AC time.

An advantage of the present invention is that a synchronous SRAM chip can access its memory array multiple times during one clock cycle.

A feature of the invention is that a response to a DMA request can occur within the same system clock cycle the DMA was received.

A feature of the invention is that a microprocessor does not need to pause its own access to memory while a DMA request is being granted.

These and other objects, advantages, and features of this invention will be apparent from the following description.

DETAILED DESCRIPTION OF THE INVENTION

Figure 1:
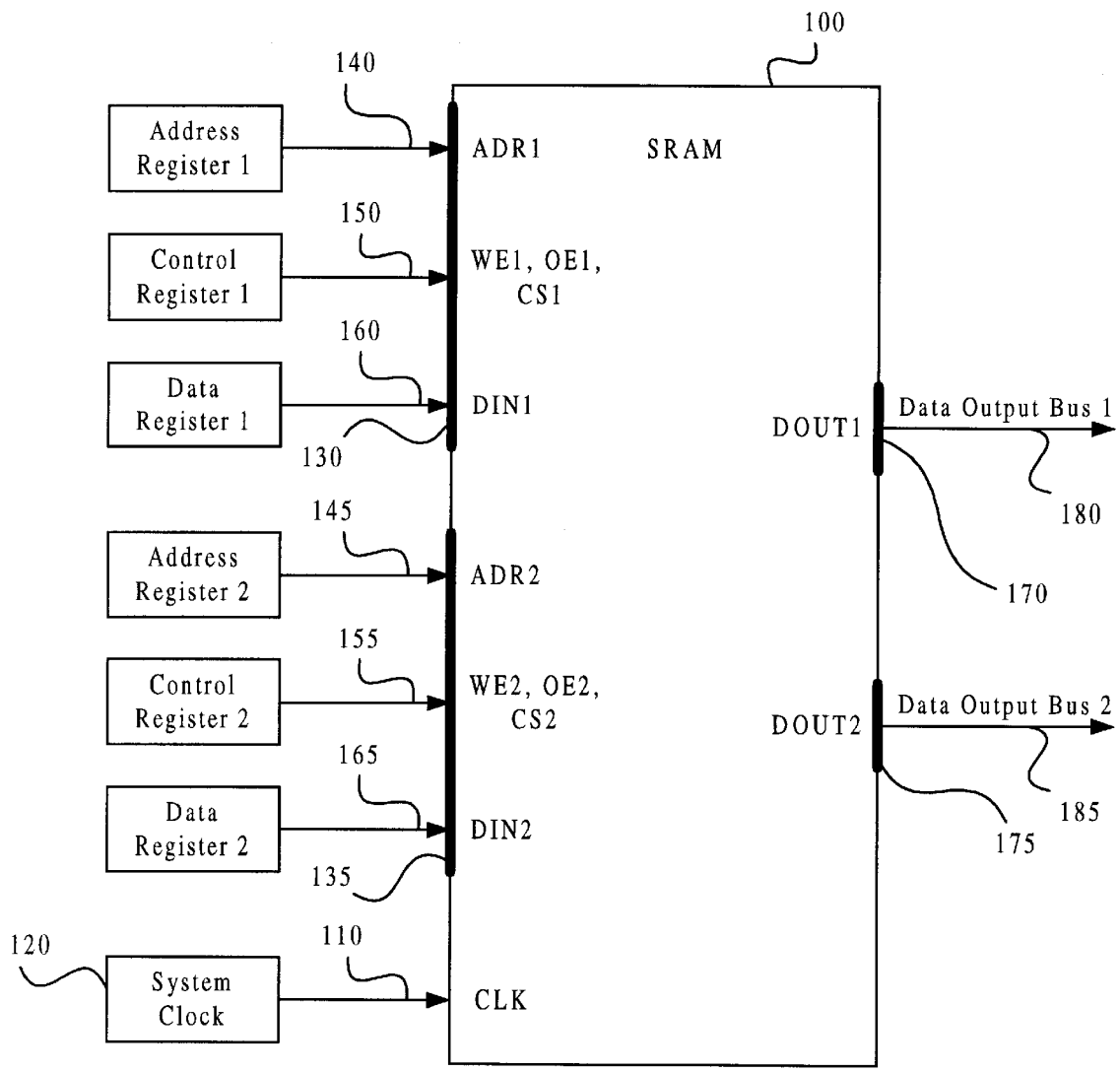
FIG. 1 is a block diagram showing the relationship between a synchronous SRAM integrated circuit and systems with which it interacts.

FIG. 1 shows a typical two port SRAM integrated circuit ("chip") 100 that is synchronized with a clock signal 110 from an external system clock 120. Each port 130, 135 can receive address signals 140, 145, control signals 150, 155, and input data signals 160, 165. The address signals 140, 145 identify a unique set of memory cells in the SRAM chip 100. The control signals 150, 155 identify what operation is required to be performed on the memory cell. The input data signals 160, 165 represents the data to be stored in the SRAM chip during a write operation. Two output ports 170, 175 compliment the two input ports 130, 135 so that output data signals 180, 185 can be communicated to other devices.

Figure 2:
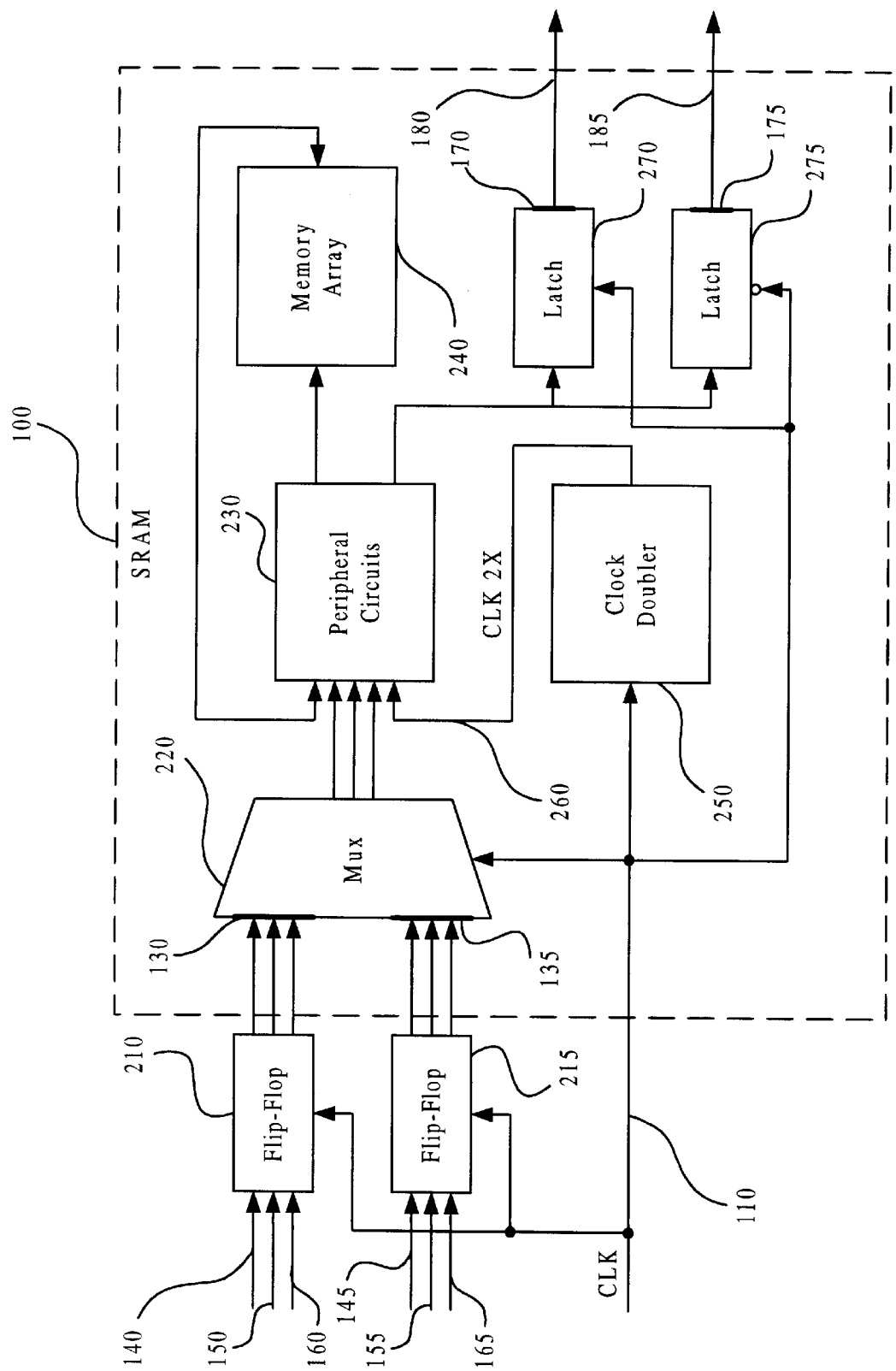
FIG. 2 is a block diagram of an SRAM chip incorporating the invention.

FIG. 2 shows the basic systems of a preferred embodiment of the invention. The address signals 140, 145, control signals 150, 155 and input data signals 160, 165 are stored in sequential circuits such as sets of flip-flops 210, 215 so that they may be accessed at any time during the external clock cycle. Whether the flip-flops 210, 215 are part of the SRAM chip 100 or part of the external system depends upon specific system requirements. A data selector such as a multiplexer 220 chooses which set of signals are passed to peripheral circuits 230 of the SRAM chip. The multiplexer 220 allows the signals from one port 130 to pass when the external clock signal 110 is high and switches to allow signals from the other port 135 to pass when the external clock signal 110 is low.

The peripheral circuits 230 communicate with a memory array 240, which is where the data is actually stored. The peripheral circuits 230 decode the address signals 140, 145, interpret the control signals 150, 155, conduct the pre-charge, and perform the read and write operations. In order to process the signals from both ports 130, 135 during one full clock cycle, the peripheral circuits 230 must be able to complete all the necessary operations of both the PC phase and the AC phase while the external clock signal 110 is in one (either high or low) state.

A clock doubler 250 produces an optimized clock signal 260 that has double the frequency of the external clock signal 110. The peripheral circuits 230 are constructed so that all the operations of the PC phase (decoding an address signal 140 or 145, interpreting the control signals 150 or 155, and conducting the pre-charge) are completed while the optimized clock signal 260 is in its high state and all the operations of the AC phase are completed when the optimized clock signal 260 is in its low state.

During the AC phase, output data 180, 185 is sent to sequential circuitry such as a pair of latches 270, 275. One latch 270 only receives output data 180 when the external clock signal 110 is high, and the other latch 275 only receives output data 185 when the external clock signal 110 is low. Once received by the latches 270, 275 the output data signals 180, 185 are accessible to the rest of the system through the output ports 170, 175 at any time until the latches 270, 275 are re-latched.

Most synchronous SRAM chips can only perform one operation per clock cycle. The PC phase is performed while a clock signal is in its high state and the AC phase is performed while a clock signal is in its low state. After the SRAM chip completes the necessary operations for a phase (e.g., address decoding, pre-charging and decision making for the PC phase) it almost always experiences short periods of inactivity ("dead time") while it waits for the external clock signal to change state so that it may begin the next phase.

Exactly how much dead time each phase experiences is a function of the external clock speed, the specific implementation of the peripheral circuitry and the physical location of the desired memory cell. Since the physical location of the memory cell is a factor, some memory cells may take longer to access than others. If the SRAM chip did not remain in a phase long enough to accommodate every memory cell, then some memory cells would be inaccessible. Therefore, some of the dead time is necessary.

Figure 3:
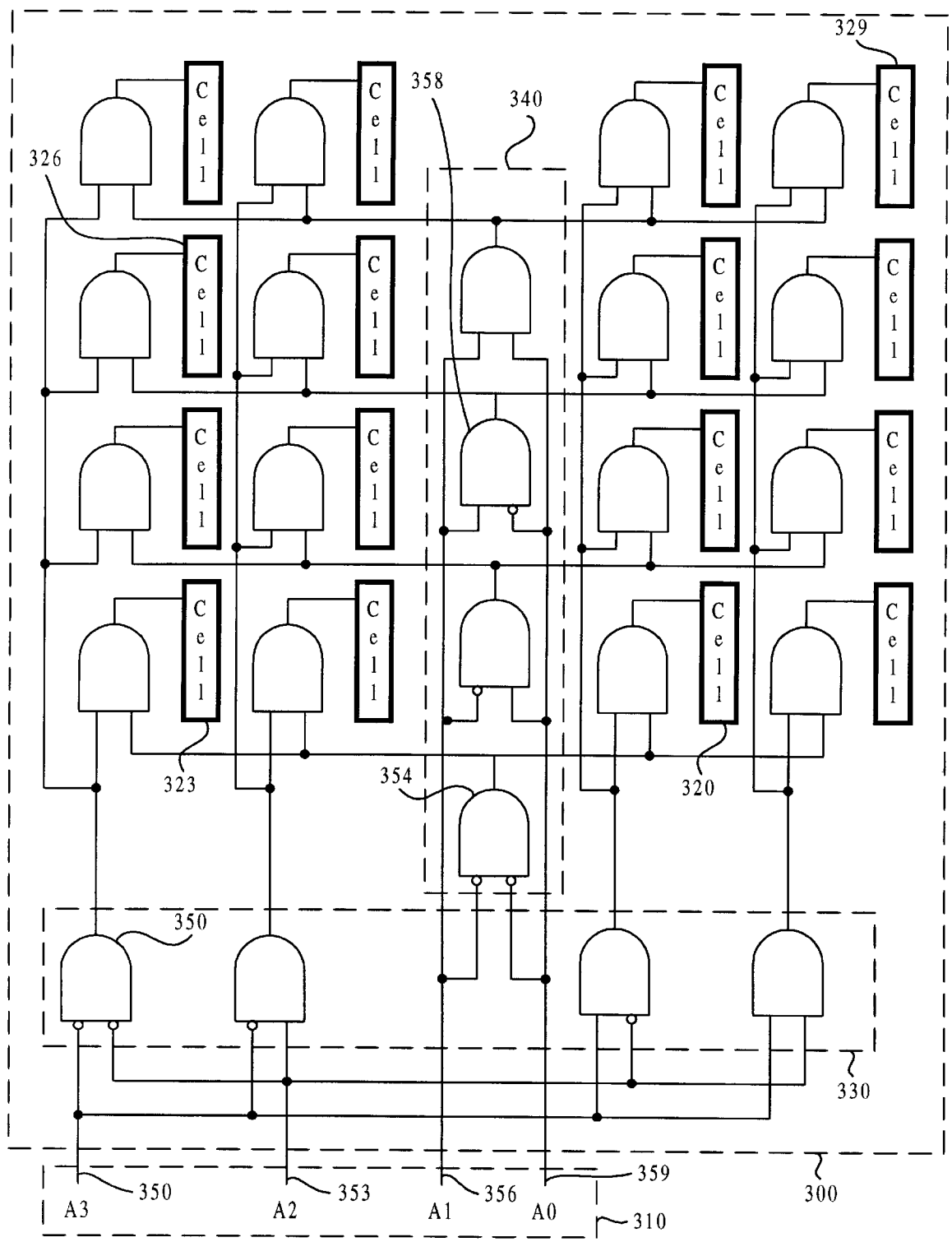
FIG. 3 is a block diagram of one possible implementation of address decoding circuitry.

FIG. 3 shows one possible implementation of address decoding circuitry 300. An address 310 four bits long is able to uniquely identify one set of memory cells (e.g., 320, 323, 326, 329) out of sixteen. The address decoding circuitry 300 is separated into a column decoder 330 and a row decoder 340. The first two bits 350, 353 of the address 310 go to the column decoder 330, and the second two bits 356, 359 of the address 310 go to the row decoder 340. The address (0000) activates only the set of memory cells 323 in the bottom left corner. The only active AND gate 350 in the column decoder 330 is in the first column and the only active AND gate 354 in the row decoder 340 is in the first row. Similarly, the address (0010) activates only the set of memory cells 326 that corresponds to the AND gate 350 in the first column and the AND gate 358 in the third row. Each unique branch may take a different length of time to activate its associated set of memory cells. Therefore, when allocating time for address decoding, the worst-case scenario circuitry must be considered.

The worst-case scenario circuit in the PC phase is the branch that requires the most time to access a particular set of memory cells. For example, if all the operations performed in the PC phase were done in series, a decision to read takes longer than a decision to write, and it takes longest to communicate with the memory cell 329 at the address (1111), then the worst-case scenario circuitry would include all the PC phase operations involved in a read to address (1111). The time required for a signal to propagate through the worst-case scenario circuitry would be the "critical PC time."

If all the operations performed in the PC phase were done in parallel, as is more frequently the case, then the worst-case scenario circuitry would only include the operation that takes the longest time to execute. Assuming a read decision takes longer than a write and communicating with the memory cell 329 at address (1111) takes the greatest amount of time, then the durations required for the read decision, decoding the address (1111), and pre-charging would have to be compared to each other. Whichever operation takes the greatest amount of time would be the worst-case scenario for that particular SRAM chip and would define the critical PC time.

The AC phase would also have a worst-case scenario circuit that represented a read or write operation to a particular set of memory cells. Once a set of memory cells 320, 323, 326, 329 is active, the appropriate peripheral circuits are able to read or write to that set of memory cells. Although not shown in FIG. 3, a set of bit lines communicate input data 160, 165 to the active set of memory cells during a write operation and communicate stored data from the latches 270, 275 during a read operation.

Similar to what was described above for the PC phase, the worst-case scenario circuit would define the "critical AC time." Together the critical AC time and the critical PC time make up the "critical cycle time." Once the critical cycle time is known, an SRAM chip can be optimized to perform multiple operations during a clock cycle. For example, if the external clock has a period that is at least three times the critical cycle time, the SRAM chip would have an optimization factor of three. By tripling the clock speed, the SRAM chip would process three times the data it would have processed at the lower clock speed. Of course, the external system would need a method of communicating three separate addresses, control signals, and input data to the SRAM chip in one system clock cycle. This could be accomplished with a three port SRAM chip.

Referring back to FIG. 2, a clock doubler 250 is used to provide the peripheral circuits 230 with an optimized clock signal 260 that is twice the frequency of the external clock signal 110. In other words, the clock doubler 250 would produce a signal 260 that transitions from low to high twice as often as the external clock signal 110. The clock doubler 250 would be appropriate for an SRAM chip 100 whose critical cycle time is less than half the period of the external clock signal 110. Known modeling and simulation techniques can be used to find the longest branches in both phases and the necessary critical cycle time.

Figure 4:
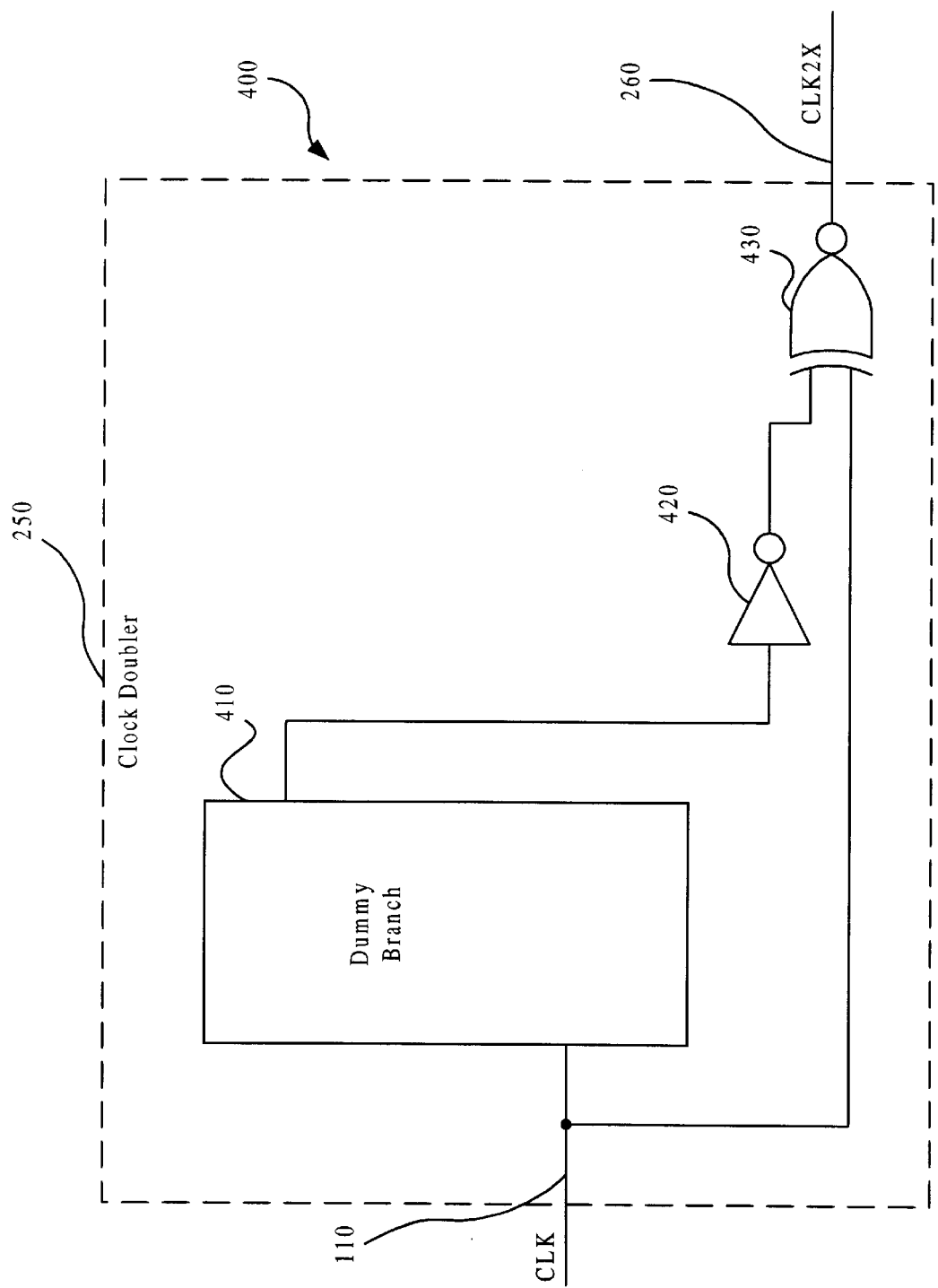
FIG. 4 is a block diagram of a subsystem of the preferred embodiment of the invention.

FIG. 4 shows a logic circuit 400 for constructing the clock doubler 250. The branch that generated the worst-case scenario in the PC phase is duplicated in the dummy branch 410. Using this method, constructing a delay of precisely the critical PC time is greatly simplified. The clock signal 110 is delayed by the dummy branch 410 and then inverted by an inverter 420. The output from the inverter is combined with the original clock signal 110 in an XNOR gate 430 to produce the optimized clock signal 260.

Figure 5A:
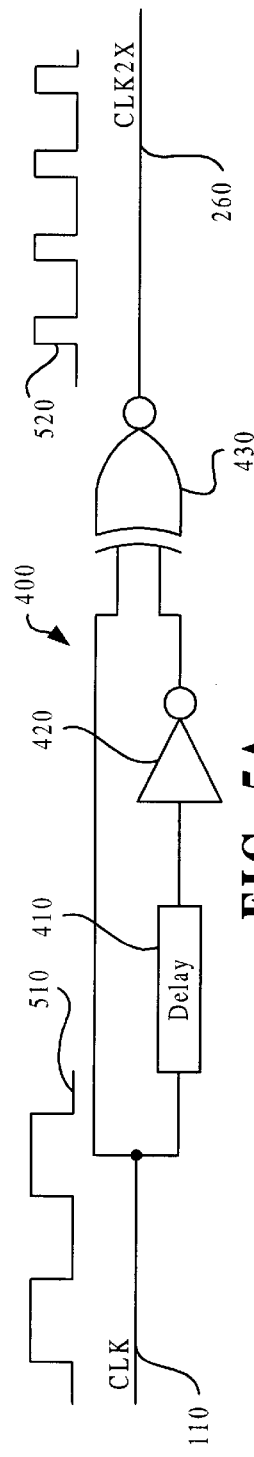
FIGS. 5A–5D are representative logic circuits that produce output signals that have half the period of an input clock signal.

FIG. 5A shows the same logic circuit 400 as is depicted in FIG. 4. Additionally, two cycles of the clock signal 110 are shown as a square waveform 510. Since the XNOR gate 430 produces a high output only when the delayed and inverted signal phase is in the same phase as the clock signal 110, the resulting waveform 520 has half the period of the original waveform 510. It should be noted that by using this method the interval for the AC phase would last for at least the critical AC time. Once it is determined that a clock doubler 250 is appropriate, fixing the PC phase to the critical PC time will necessarily give the AC phase the time it requires.

Figure 5B:
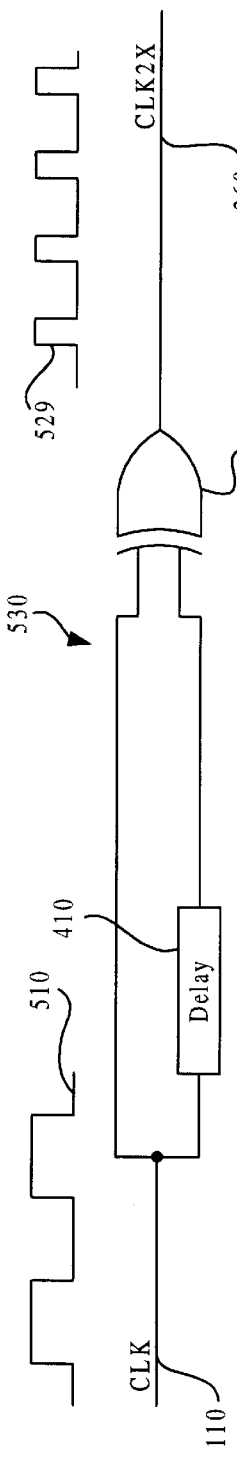
Figure 5C:
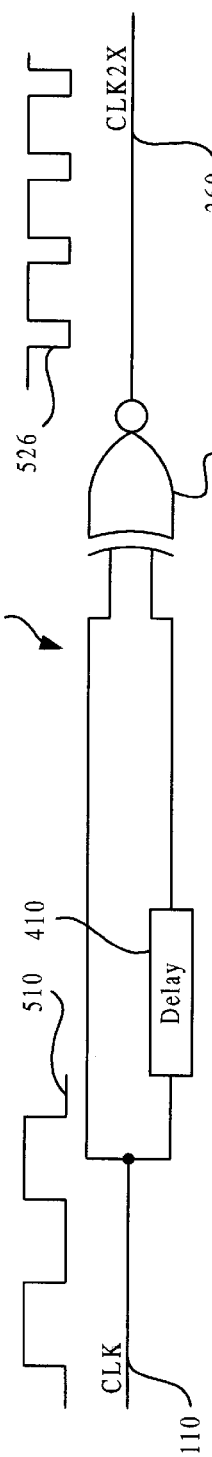
Figure 5D:
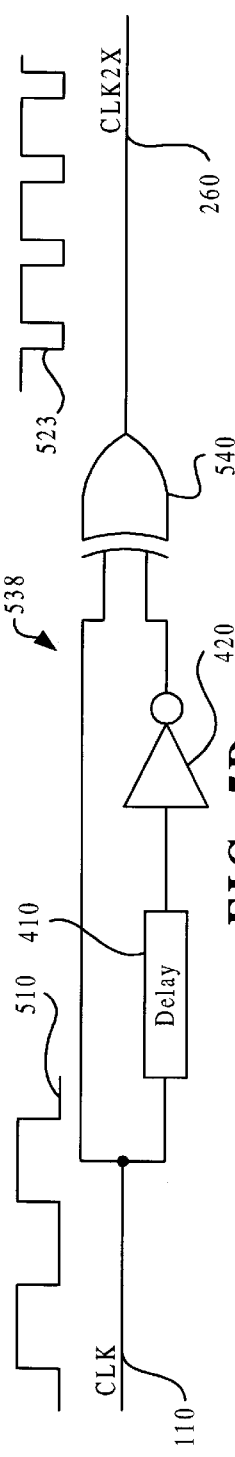

FIGS. 5B–5D show some alternative logic circuits 530, 534, 538 for the clock doubler. The alternative logic circuit 538 shown in FIG. 5D replaces the XNOR gate 430 in FIG. 5A with an XOR gate 540. The resulting waveform 523 is the compliment of the waveform 520 produced by the logic circuit 400 shown in FIG. 5A. As shown in FIG. 5C, omitting the inverter 420 and using an XNOR gate 430 produces an output waveform 526 that is the same as the waveform 523 in FIG. 5D. FIG. 5B indicates that by using an XOR gate 540 and omitting the inverter 420, the resulting waveform 529 is the same as the waveform 520 produced by the logic circuit 400 of FIG. 5A. Of course, the logic circuits 400, 530 shown in FIGS. 5A and 5B require active-high logic and the logic circuits 534, 538 shown in FIGS. 5C and 5D require active-low logic.

The inventors hypothesize that the logic circuits shown in FIGS. 5A and 5D may be superior to the others because of the use of the inverter 420. If imperfections on the silicon wafer cause the dummy branch 410 to not exactly replicate the time it takes for the worst-case scenario, then the extra circuitry involved in the inverter 420 may provide enough additional delay to compensate for the inadequate dummy branch 410. However, care must be taken because if time is allocated to the PC phase over the critical PC time, then time will be taken away from the AC phase.

Figure 6:
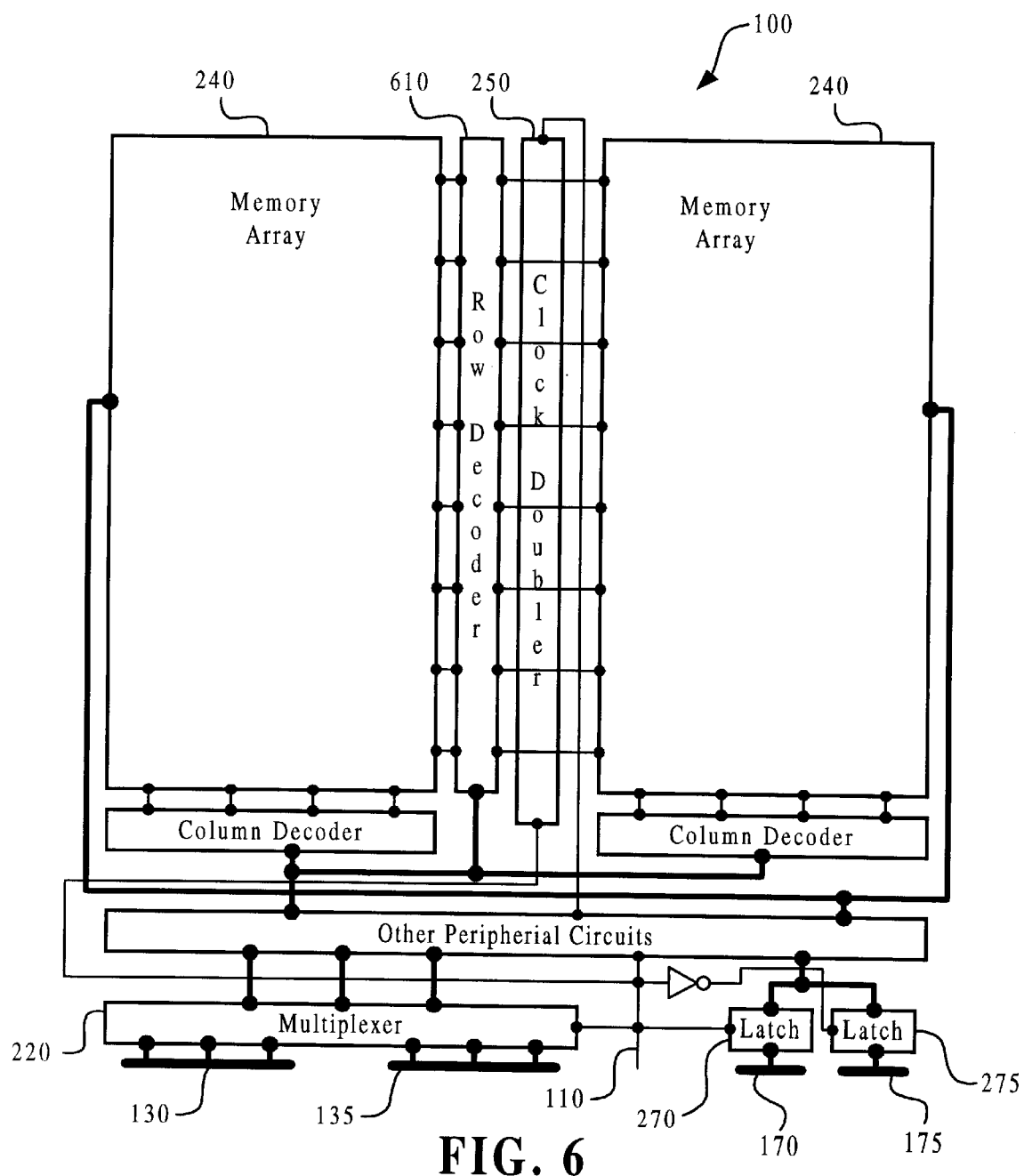
FIG. 6 is a layout of a preferred embodiment of the invention.

FIG. 6 shows the layout of a preferred embodiment of the invention. In the particular SRAM chip 100, modeling and simulation techniques were used to determine that a clock doubler 250 is appropriate and that the row decoder 610 portion of the address decoder takes the longest interval of time for the worst-case scenario. The clock doubler 250 is positioned physically next to the row decoder 610 for a more accurate delay.

Figure 7:
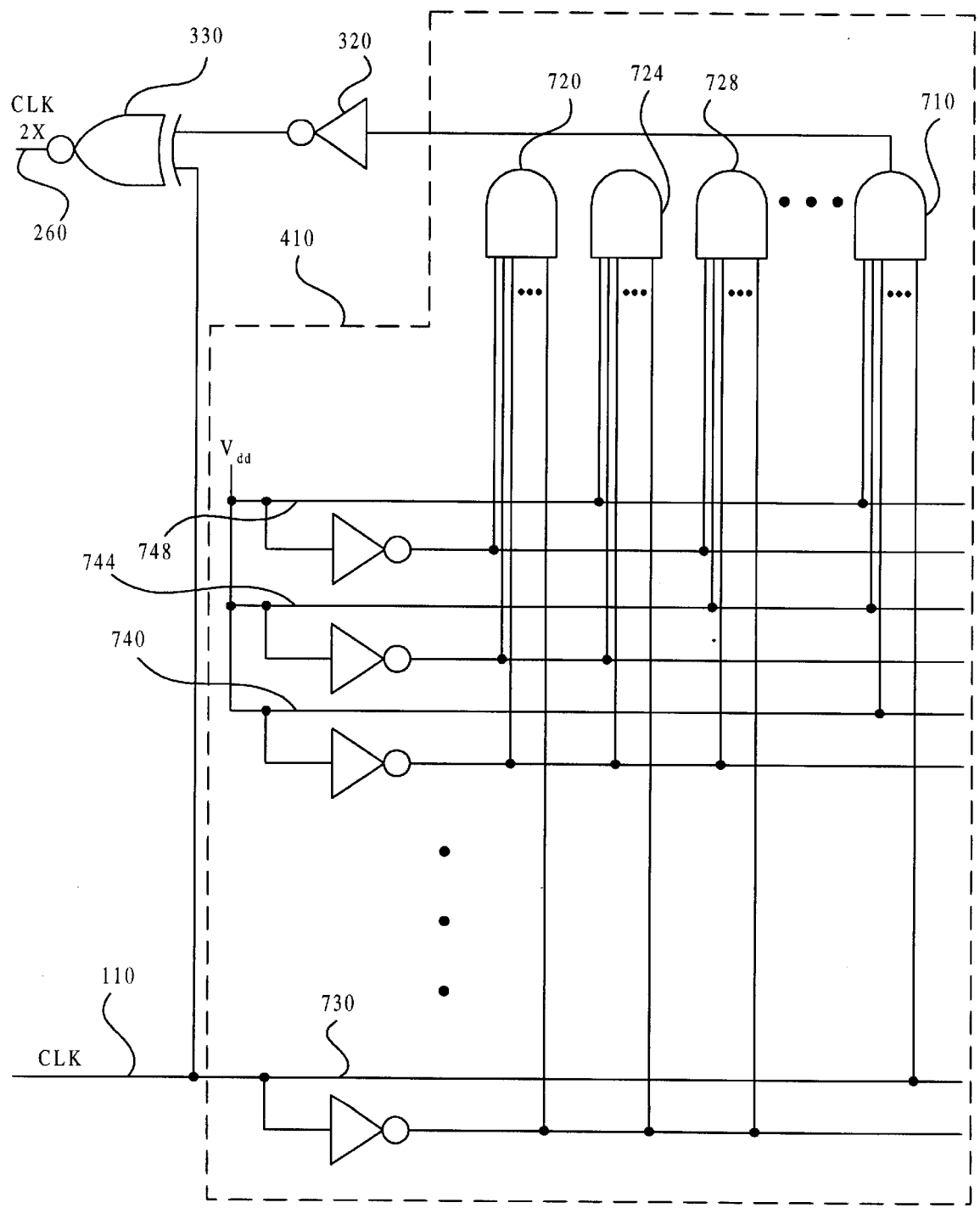
FIG. 7 is a circuit diagram of a subsytem of the preferred embodiment of the invention.

FIG. 7 shows one possible architecture of the clock doubler 250. In this case, the specific address of the worst-case scenario for the row decoder 610 was determined to be (111 . . . 1). The delay circuit 410 is a dummy branch representing the same circuitry as the row decoder 610. Instead of activating a memory cell, the output of the AND gate 710 is inverted and used as an input for an XOR gate 330 to produce an optimized clock signal 260. All other AND gates 720, 724, 728 are non-functional and have no output. While not required, these non-functional AND gate circuits 720, 724, 728 are used to better approximate both the capacitance and the placement of the worst-case scenario circuitry. Only the dummy address line 730 that it is the furthest distance from the active AND gate 710 receives the clock signal 110. The other dummy address lines 740, 744, 748 are permanently tied to the high state.

One possible use of the invention is to dedicate one port to DMA accesses. Typically, a processor is designed such that program memory and data memory are accessed separately. Each operation usually only requires a single access to each type of memory, which can be performed in one cycle. Therefore, under this architecture, there is no need for a second access port. By allowing all DMAs to use the second port, the processor would not be required to arbitrate DMA requests. Of course, the processor would still need to communicate with a DMA controller for allocation of memory blocks and other similar functions.

Although the invention has been described in its presently contemplated best mode, it is clear that it is susceptible to numerous modifications, modes of operation and embodiments, all within the ability and skill of those familiar with the art and without the exercise of further inventive activity. Accordingly, that which is intended to be protected by Letters Patents is set forth in the claims and includes all variations and modifications that fall within the spirit and scope of the invention.

We claim:

1. An SRAM chip synchronizable with a periodic external clock signal, comprising:

a memory array having a plurality of memory cells;

peripheral circuits, operably connected with the memory array, controlling the operation of the SRAM chip, and including peripheral pre-charge (PC) phase circuits controlling the operation of a PC phase and having a plurality of PC branches, each with a destination, the branches including a longest PC branch that is the PC branch that takes the longest interval of time to communicate with its destination, the longest PC branch being characterized by a critical PC time equal to the time needed for a signal to propagate to the destination of the PC branch; and a clock doubler, operably connected with the peripheral circuits, receiving the external clock signal, and including:

a delay circuit that receives the external clock signal as an input and outputs a delayed clock signal that is delayed by at least the critical time; and a logic circuit that receives the delayed clock signal and the external clock signal as inputs and in response outputs a signal that has a period half that of the external clock signal.

2. The SRAM chip of claim 1 wherein the delay circuit duplicates the circuitry of the longest PC branch.

3. The SRAM chip of claim 2 wherein the delay circuit is physically positioned in close proximity to the longest PC branch.

4. The SRAM chip of claim 2, further comprising:

two ports for receiving input data, control signals and address signals;

a data selector, outputting the input data, control signals and address signals received from one port to the peripheral circuits when the external clock signal is high and outputting the input data, control signals and address signals received from the other port to the peripheral circuits when the external clock signal is low; and a pair of sequential circuits, operably connected with the peripheral circuits, responsive to the external clock signal such that one sequential circuit will only store data when the external clock signal is high and the other sequential circuit will only store data when the external clock signal is low.

5. The SRAM chip of claim 4 wherein one port is dedicated for direct memory accesses.

6. The SRAM chip of claim 2 wherein the logic circuit is an exclusive OR gate.

7. The SRAM chip of claim 2 wherein the logic circuit is an exclusive NOR gate.

8. The SRAM chip of claim 2 wherein the clock doubler further comprises an inverter circuit operably connected to the delay circuit, the inverter circuit causing the delayed clock signal to be inverted prior to being received by the logic gate.

9. The SRAM chip of claim 8 wherein the logic circuit is an exclusive OR gate.

10. The SRAM chip of claim 8 wherein the logic circuit is an exclusive NOR gate.

11. A method for designing an SRAM chip synchronizable with a periodic external clock signal, comprising:

designing a preliminary architecture of an SRAM chip having peripheral circuits and a plurality of memory cells;

determining a critical PC time which is the interval of time needed for a worst-case PC scenario operation that requires the most time to execute during the PC phase;

determining a critical AC time which is the interval of time needed for a worst-case AC scenario operation that requires the most time to execute during the AC phase;

determining an optimization factor which is the number of times the critical AC time added to the critical PC time can go into the period of an external clock cycle;

creating an optimization circuit useful to receive a clock signal as an input and output an optimized clock signal that transitions from its high state to its low state a number of times equal to the optimization factor times the number of times the external clock transitions from its high state to its low state, the optimized clock signal remaining in its active states for at least the critical PC time and its inactive state for at least the critical AC time;

designing the final architecture for the SRAM chip, the final architecture including the plurality of memory cells, the peripheral circuits and the optimization circuit.

12. The method of claim 11 wherein the step of creating an optimization circuit further comprises creating a delay circuit that can delay a signal for at least the critical PC time.

13. The method of claim 12 wherein the step of creating a delay circuit further comprises duplicating the circuitry of the worst-case PC scenario.

14. The method of claim 12 further comprising the step of using the SRAM chip in a microprocessor that does not need to pause its own access of the SRAM chip while a direct memory access is performed.

15. An SRAM chip synchronized with an external periodic signal, comprising:

a memory array having a plurality of memory cells and a plurality of bit lines operably connected with the plurality of memory cells;

control circuitry, operably connected with the memory array, regulating the operation of the memory cells, and being characterized by a control time equal to the interval of time the control circuitry requires to complete its most time-consuming operation;

an address decoder, operably connected with the memory array, selecting a single set of memory cells within the memory array, and being characterized by an address time equal to the interval of time the address decoder requires to complete its most time-consuming operation;

pre-charge circuitry, operably connected with the memory array, charging the bit lines of the memory array to a predetermined state, and being characterized by a pre-charge time equal to the interval of time the pre-charge circuitry requires to complete its most time-consuming operation;

read circuitry, operably connected with the bit lines of the memory array, receiving signals from the memory cells within the memory array, and being characterized by a read time equal to the interval of time the read circuitry requires to complete its most time-consuming operation;

write circuitry, operably connected with the bit lines of the memory array, replacing the signals stored by the memory cells within the memory array, being characterized by a write time equal to the interval of time the write circuitry requires to complete its most time-consuming operation; and a signal optimizer, operably connected with the control circuits, address decoder, pre-charge circuitry, read circuitry and write circuitry, receiving the external periodic signal, and transforming the external periodic signal into a signal that transitions from a high state to a low state a greater number of times than the external periodic signal that maintains its active states for at least a critical PC time and its inactive state for at least a critical AC time, the critical PC time being equal to either the control time, the address time, or the pre-charge time, whichever is larger, and the critical AC time being equal to either the write time, or the read time, whichever is larger.

16. The SRAM chip of claim 15 wherein the SRAM chip is only used for direct memory accesses when the external periodic signal is either low or high.

17. The SRAM chip of claim 15 wherein the period of the external periodic signal is a whole multiple of the period of the higher frequency signal.

18. The SRAM chip of claim 15 wherein the signal optimizer further comprises a delay circuit, the delay circuit duplicating circuitry that generated the critical PC time.

19. The SRAM chip of claim 18 wherein the circuitry that generates the critical PC time is the address decoding circuitry.

20. The SRAM chip of claim 18 wherein the circuitry that generates the critical PC time is the control circuitry.

* * * * *